US007345653B2

(12) United States Patent
Nolan et al.

(10) Patent No.: US 7,345,653 B2
(45) Date of Patent: Mar. 18, 2008

(54) SHAPED REFLECTOR REOPTIMIZATION

(75) Inventors: Michael Nolan, Hermosa Beach, CA (US); David Bressler, Los Angeles, CA (US); George Voulelikas, El Segundo, CA (US)

(73) Assignee: The Boeing Company, Chicago, IL (US)

(*) Notice: Subject to any disclaimer, the term of this patent is extended or adjusted under 35 U.S.C. 154(b) by 67 days.

(21) Appl. No.: 11/062,996

(22) Filed: Feb. 22, 2005

(65) Prior Publication Data
US 2006/0170612 A1 Aug. 3, 2006

Related U.S. Application Data

(60) Provisional application No. 60/649,627, filed on Jan. 31, 2005.

(51) Int. Cl.
*H01Q 15/14* (2006.01)

(52) U.S. Cl. .................. 343/912; 343/781 P
(58) Field of Classification Search .......... 343/912, 343/781 P, 781 CA, 781 R, 836, 837, 840
See application file for complete search history.

(56) References Cited

U.S. PATENT DOCUMENTS

| 4,298,877 A | * | 11/1981 | Sletten | 343/781 CA |
| 4,755,826 A | * | 7/1988 | Rao | 343/781 P |
| 4,757,325 A | * | 7/1988 | Thompson et al. | 343/781 R |
| 5,790,077 A | * | 8/1998 | Luh et al. | 343/781 P |
| 6,977,622 B2 | * | 12/2005 | Hay et al. | 343/781 P |

FOREIGN PATENT DOCUMENTS

EP 0438664 A2 7/1991

OTHER PUBLICATIONS

Imbriale, W.A., "Distortion compensation techniques for larg reflector antennas," Aerospace Conference, 2001, IEEE Proceedings. Mar. 10-17, 2001, vol. 2, pp. 799-805, Sep. 15, 1988.
Clarricoats, P.J. et al., "A reconfigurable Satellite Reflector Antenna," Proceedings of the European Microwave Conf., vol. Conf. 18, pp. 482-487, Sep. 12, 1988.
Clarricoats, P.J. et al., "Design and Performance of a Reconfigurable Mesh Reflector Antenna \Part 1: Antenna Design," IEE Proceedings, vol. 138, No. 6, part H, pp. 485-492, Dec. 1, 1991.
Monk, A.D. et al., "Null synthesis for mesh reflector antennas," Antennas and Propogation, 1991, ICAP 91., Seventh International Conf. on (IEE), 1991, pp. 326-329.
International Applicaion PCT/US2005/040597 International Search Report and Written Opinion, Jan. 22, 2007.

* cited by examiner

*Primary Examiner*—Huedung Mancuso
(74) *Attorney, Agent, or Firm*—Canady & Lortz LLP; Bradley K. Lortz

(57) ABSTRACT

An invention is provided for generating a shaped reflector. The invention includes receiving required performance data that defines a desired RF performance of a shaped reflector. A mathematical model of the shaped reflector is manipulated to generate a new geometry for the shaped reflector, which is capable of generating the desired RF performance. To ensure the new geometry can be physically duplicated with high precision, the mathematical model is manipulated in a manner that can be duplicated using a plurality of tuners associated with the shaped reflector. Once the new geometry is created, data is outputted that defines alterations to the plurality of tuners needed to generate the new geometry for the shaped reflector.

18 Claims, 4 Drawing Sheets

SHAPED REFLECTOR REOPTIMIZATION

This application claims the benefit under 35 U.S.C. §119(e) of the following co-pending U.S. provisional patent application, which is incorporated by reference herein:

U.S. Provisional Application Ser. No. 60/649,627, filed Jan. 31, 2005, by Michael Nolan et al., entitled "SHAPED REFLECTOR REOPTIMIZATION".

BACKGROUND OF THE INVENTION

1. Field of the Invention

This invention relates generally to RF antenna, and more particularly to high precision shaped reflector optimization for antenna.

2. Description of the Related Art

Today, spaceborne satellite systems are used to transmit and receive electromagnetic energy for communication and other purposes. To focus the electromagnetic energy, satellite systems frequently use an antenna assembly that includes a main reflector and a feed assembly located at a focal point of the main reflector. In operation, the feed assembly illuminates the main reflector with an electromagnetic energy beam. The main reflector then reflects and focuses the electromagnetic energy beam into a radiation pattern for transmission to Earth. Similarly, the main reflector focuses impinging electromagnetic energy from a radiation pattern into a reflected beam on the feed assembly when the antenna assembly is receiving a signal.

It is advantageous to reduce the amount of wasted power in satellite antenna because of the extreme losses caused by the transmission distance. Power is wasted when unwanted areas on the Earth's surface receive a portion of the transmitted signal. Hence, advanced antenna designs are tuned to the desired coverage region so that as much power as possible is gathered from the region while little or no power is gathered from outside of the region. Accordingly, antennas generally are designed to transmit and receive signals having radiation patterns contoured to fit the shape of a desired coverage region. For example, the desired coverage region may be Europe, the continental United States, or a group of cities.

The current state of the art for producing shaped contour radiation patterns is to use a shaped main reflector. A shaped main reflector is a main reflector that has had its surface shaped to produce a desired radiation pattern. Antenna systems frequently employ a shaped reflector to collimate or focus a beam of energy into a selected shaped beam pattern with high radiation efficiency. In doing so, a feed horn is generally employed to communicate with the shaped surface contour of the reflector to radiate energy off the reflector and/or receive energy therefrom. Hence, a shaped reflector advantageously allows the use of a single feed horn to obtain the desired beam pattern. Various methodologies are currently used to generate and build a shaped reflector surface, as illustrated in FIG. 1.

FIG. 1 is a flowchart showing a prior art method 100 for generating a shaped reflector. In an initial operation 102, preprocess operations are performed. Preprocess operations can include, for example, determining desired coverage area for a particular antenna usage, determining RF signal requirements based on the desired coverage area, and other preprocess operations that will be apparent to those skilled in the art.

In operation 104, an ideal reflector surface is generated based on predefined RF requirements. With the predefined RF requirements set, a reflector surface shape is defined. This generally is accomplished using an RF optimizer, which is a computer program capable of generating reflector surfaces to meet a set of performance requirements over a prescribed coverage region. RF optimizers operate on math models of the reflector surface definition, which generally is initially defined as a parabola. It is important to note that the same coverage region can be produced from a virtually infinite number of different reflector shapes; there is no single mathematically perfect solution which will achieve the desired coverage.

With no knowledge of the existence of surface tuners or of the precision of the reflector surface currently in assembly, an RF optimizer arbitrarily manipulates the math model of the surface to produce a modified surface shape. The RF optimizer then predicts the performance of the modified surface and compares the predicted performance with the predetermined RF requirements to determine if the modification is beneficial. If the modification is beneficial, the modification is incorporated. This process is repeated through much iteration until the predicted performance is optimized for the predetermined RF requirements.

In operation 106, a shaped reflector is designed and built to closely match the ideal reflector surface generated in operation 104. Typically, space qualified techniques are used to manufacture the shaped reflector to achieve a shape very close to the ideal reflector surface. Generally, the reflector comprises a carbon fiber or KEVLAR (polyamide) composite RF reflective surface mounted to a backing structure.

Once the shaped reflector is built, the shaped reflector surface is measured in operation 108. One technique used for measuring the surface of a shaped reflector is photogrammetry. Photogrammetry is a 3D measurement technique wherein reflective targets are placed on the shaped reflector surface and a series of shots are taken using a camera that includes a stroboscope. Using control points and triangulation points, software bundles the measured data and the geometry of the shaped reflector surface is reconstructed with very high precision.

In operation 110, the measured shaped reflector surface is compared to the ideal reflector surface. Unfortunately, as the reflector is being built, the shaped reflector surface drifts from the ideal shaped reflector surface due to several factors. For example, the build-up of internal stresses that result with the materials used in the manufacturing process is one such factor. Hence, due to a number of factors, the measured shaped reflector surface will be different than the ideal reflector surface.

To compensate for these differences, in operation 112, the shaped reflector surface is tuned to better approximate the ideal reflector surface. When manufacturing the shaped reflector, tuners are located at discrete points along the backside of the shaped reflector surface. The tuners provide adjustability by displacing the surface normal to the surface's defined surface plane. Hence, the tuners are used to adjust the shaped reflector surface to closer resemble the originally prescribed ideal reflector surface generated in operation 104. Post process operations are then performed in operation 114 that normally include re-adjusting the feed/ reflector geometry relationship analytically to accommodate the inaccuracies of the final as-build reflector. Post process operations can also include, for example, redesigning the reflector surface if the surface cannot be adjusted to perform properly, and other post process operations that will be apparent to those skilled in the art.

Very high performance antenna systems rely on very tight surface tolerances to meet their requirements. As the performance requirements increase, higher and higher reflector surface precision is needed to meet the increased performance requirements. Unfortunately, in modern spacecraft antenna systems the accuracy that can be maintained with the prior art methodology outlined in FIG. 1 limits the antenna's ability to meet these stringent performance requirements. In view of the foregoing, there is a need for techniques capable of generating shaped reflectors with increased precision.

SUMMARY OF THE INVENTION

Broadly speaking, embodiments of the present invention utilize tuner data regarding the location and adjustment properties of tuners to generate a shaped reflector surface. In one embodiment, a computer program embodied on a computer readable medium is disclosed for generating a shaped reflector. The computer program includes program instructions that receive required performance data defining a desired RF performance of a shaped reflector. Program instructions are also included that manipulate a mathematical model of the shaped reflector to generate a new geometry for the shaped reflector, which is capable of generating the desired RF performance. Here, a mathematical model is generated that represents a plurality of tuners to describe the shaped reflector. Once the new geometry is created, the computer program outputs data defining alterations to the plurality of tuners needed to generate the new geometry for the shaped reflector. In one embodiment, program instructions are included that model an RF signal based on the new geometry and compare the modeled RF signal to the required performance data to obtain a signal performance difference. In this case, when the signal performance difference exceeds a predetermined threshold, the new geometry for the shaped reflector can be altered to increase performance.

In a further embodiment, a method for generating a shaped reflector is disclosed. The method includes receiving required performance data that defines a desired RF performance of a shaped reflector. Then, a mathematical model of the shaped reflector is manipulated to generate a new geometry for the shaped reflector, which is capable of generating the desired RF performance. As above, the mathematical model is manipulated in a manner that can be duplicated using a plurality of tuners associated with the shaped reflector, and output data is provided that defines alterations to the plurality of tuners to generate the new geometry. In one embodiment, current reflector geometry data is received that defines the shaped reflector as physically built. The current reflector geometry data includes tuner data for the plurality of tuners in contact with the shaped reflector. As noted previously, each tuner is capable of altering a contour of the shaped reflector. In this case, the tuner data is utilized to manipulate the mathematical model in a manner that can be duplicated using the plurality of tuners, thus allowing the reflector surface to be physically duplicated to a high degree of precision, essentially zero error with current state of the art measuring systems.

A further method for generating a shaped reflector is disclosed in an additional embodiment of the present invention. The method includes receiving current reflector geometry data that defines a shaped reflector as physically built. The current reflector geometry data includes tuner data for a plurality of tuners that is in contact with the shaped reflector. As above, each tuner is capable of altering a contour of the shaped reflector. Required performance data is then received that defines a desired RF performance. A new geometry for the shaped reflector is determined based on the current reflector geometry data and the tuner data by manipulating geometry that can be duplicated using the plurality of tuners. In this manner, a shaped reflector having the new geometry will be capable of generating the desired RF performance. In generating the new geometry, the current reflector geometry data can be divided into sections based on the tuner data. In this case, a set of failing sections can be determined that includes sections that do not meet the desired RF performance based on the required performance data. Then, the failing sections can be mathematically adjusted to generate the new geometry. Since, the surface of the reflector is computer generated by mathematically manipulating the surface model at the tuner locations, the reflector surface can be physically duplicated to a high degree of precision. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for generating a shaped reflector. In general, embodiments of the present invention utilize tuner data regarding the location and adjustment properties of tuners to generate a shaped reflector surface. In this manner, embodiments of the present invention manipulate a math model of the reflector surface in a manner that can be duplicated by physically adjusting tuners located at discrete locations along the back of the manufactured shaped reflector surface. The definition of the geometry being assembled is changed to one that can be duplicated by the actual hardware. As a result, the manufactured shaped reflector surface can be physically adjusted to meet the reflector surface precision needed to meet increased performance requirements.

Although improvements in manufacturing precision will naturally yield improvements in reflector performance, embodiments of the present invention exceed what may be attained through state of the art manufacturing precision. Embodiments of the present invention take advantage of the fact that there is no single ideal reflector shape to produce a desired coverage region, as previously discussed. Accordingly, reflector performance may be further improved by modifying the model in view of the constraints in the adjustment that can be made to the physical reflector.

In addition, with knowledge of the change in reflector surface geometry at the anticipated extreme temperatures seen in orbit, further embodiments of the invention can optimize a new surface to counteract the thermal environment effects. Presently, this data is generated by analysis and/or test to determine the degradation in RF performance due to the reflector surface geometry changes.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
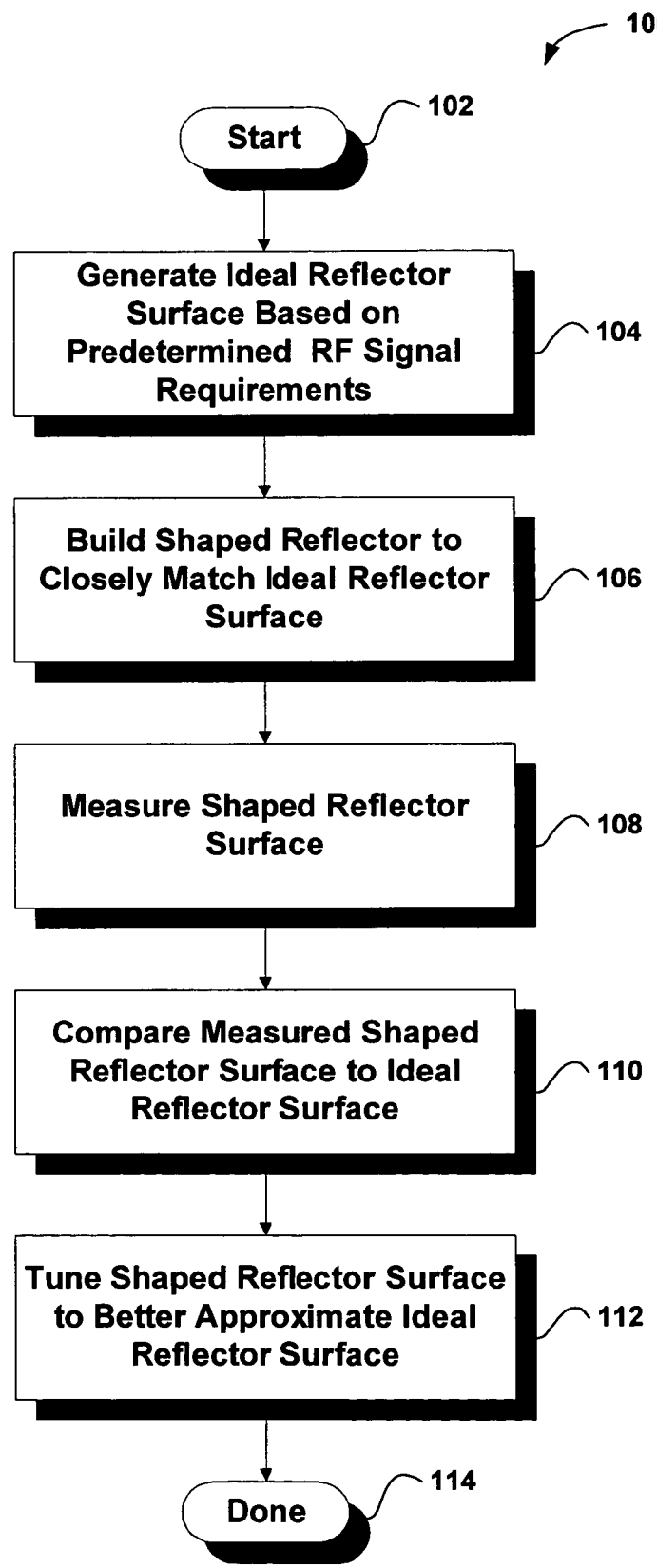
FIG. 1 is a flowchart showing a prior art method for generating a shaped reflector.
Figure 2:
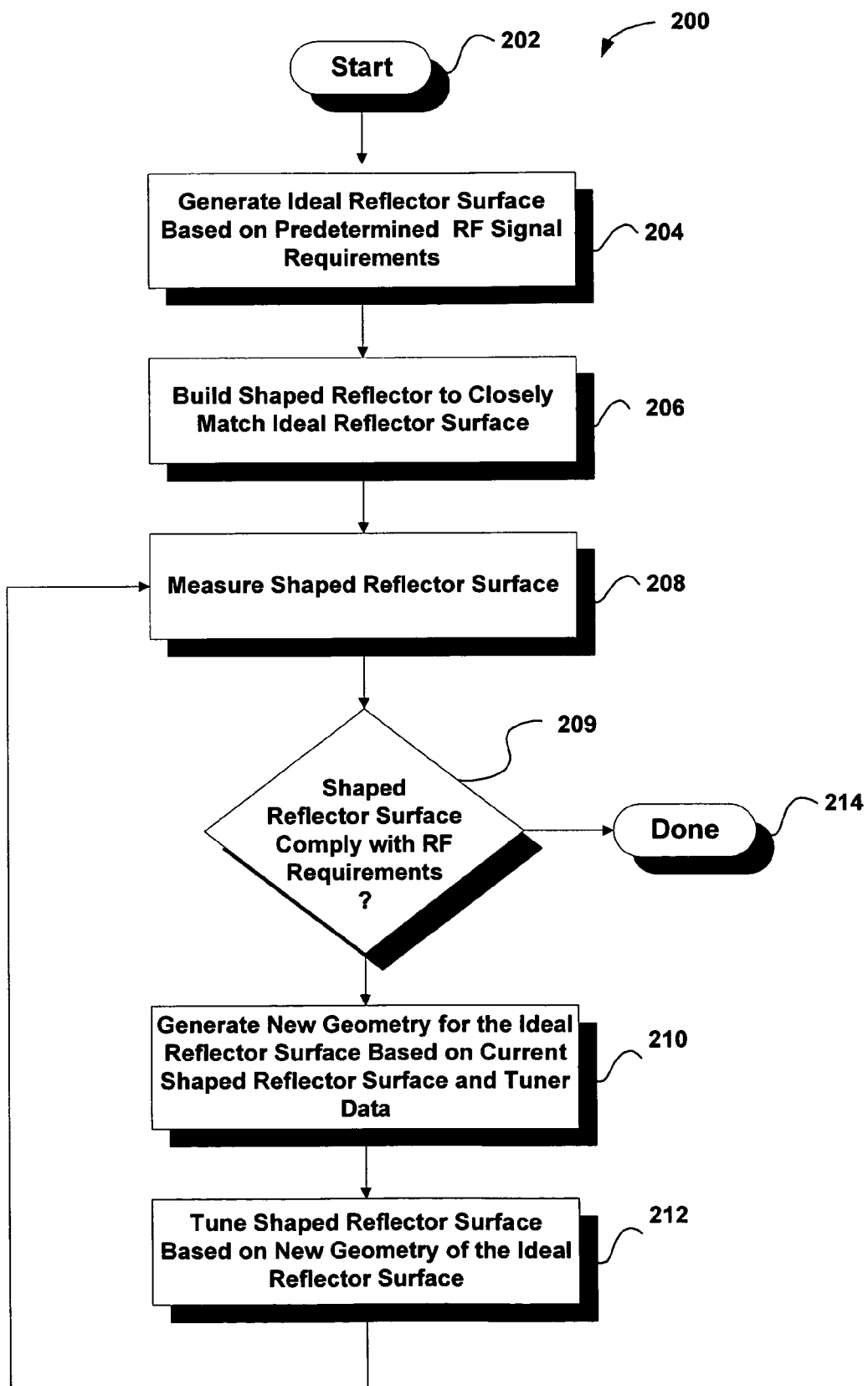
FIG. 2 is a flowchart showing a method for generating a shaped reflector, in accordance with an embodiment of the present invention.

FIG. 1 was described in terms of the prior art. FIG. 2 is a flowchart showing a method 200 for generating a shaped reflector, in accordance with an embodiment of the present invention. In an initial operation 202, preprocess operations are performed. Preprocess operations can include, for example, determining desired coverage area for a particular antenna usage, determining RF signal requirements based on the desired coverage area, and other preprocess operations that will be apparent to those skilled in the art after a careful reading of the present disclosure.

In operation 204, an initial ideal reflector surface is generated based on predefined RF requirements. With the predefined RF requirements set, a reflector surface shape is defined using, in one embodiment, an RF optimizer. As mentioned above, RF optimizers operate on math models of the reflector surface definition, which generally is initially defined as a parabola. The RF optimizer manipulates the math model of the surface to produce a modified surface shape. The RF optimizer then predicts the performance of the modified surface and compares the predicted performance with the predetermined RF requirements to determine if the modification is beneficial. If the modification is beneficial, the modification is incorporated. This process is repeated through much iteration until the predicted performance matches the predetermined RF requirements.

In operation 206, a shaped reflector is designed and built to closely match the initial ideal reflector surface generated in operation 204. Typically, the shaped reflector is created using a mandrel, which is contoured to the ideal reflector surface shape defined in operation 204. Once baked in an autoclave, the shaped reflector and the backing structure are assembled up to the point of permanently attaching the shaped reflector to the backing structure. A temporary attachment is made with a set of tools capable of adjusting the space between the backing structure and the shaped reflector at a plurality of discrete tuner points.

Once the shaped reflector is built, the shaped reflector surface is measured in operation 208. As mentioned previously, photogrammetry can be used to measure the surface of a shaped reflector. Because the composite material is molded using the curved surface of a mandrel, and adhesive is needed, the shaped reflector surface distorts when baked in an autoclave. The shaped reflector also builds up stresses as it bakes. Further, as the shaped reflector is attached to the backing structure more stresses build up which change the surface of the shaped reflector again. As a result, the manufactured shaped reflector surface no longer matches the ideal shaped reflector surface generated in operation 204.

Once the as-built shaped reflector surface is measured, the data is manipulated into a format that can be used to perform RF analysis. The as-built shaped reflector surface is then RF analyzed to verify whether the antenna meets the predefined RF requirements in operation 209. If the as-built shaped reflector surface meets the predefined RF requirements, the method 200 ends in operation 214. Otherwise, the method 200 proceeds to operation 210.

In operation 210, a new geometry for the ideal reflector surface is generated based on the current shaped reflector surface and on related tuner data. Broadly speaking, embodiments of the present invention alter the math model of the shaped reflector at the tuner locations, which allows the modification of the actual physical shaped reflector to duplicate the changes made to the math model. In this manner, embodiments of the present invention examine the actual predefined RF performance and make changes to the math model of the shaped reflector to meet the RF performance with respect to the requirements where required. Thus, embodiments of the present invention concentrate on where the electromagnetic energy is focused on the Earth, rather than on the actual geometry of the reflected surface.

Once the predicted RF performance of the math model matches the predetermined RF signal requirements, the physical shaped reflector surface is tuned to match the new geometry of the ideal reflector surface in operation 212. That is, the shape of the physically built reflector is altered to match the computer generated shape using tuners. As mentioned above, tuners provide adjustability by displacing the surface normal to its defined surface plane. For example, tuners can be adjusted up and down to alter the reflector shape.

Once the shaped reflector surface has been tuned to the new desired geometry, operations 208 and 209 are repeated. A measurement from the surface of the built reflector is taken again and analyzed for compliance. If further adjusting is needed, the new reflector shape is provided to the program, along with the current RF results, and new adjustment output is generated, in operation 210. The new adjustment output can then be used to alter the reflector shape again, in operation 212, bringing the RF output further in line with the predetermined requirements. However, if the shaped reflector surface does meet the predefined RF requirements, post process operations are then performed in operation 214. Post process operations can include, for example, permanently attaching the shaped reflector to the backing structure, further antenna assembly, and other post process operations that will be apparent to those skilled in the art after a careful reading of the present disclosure.

As mentioned above, embodiments of the present invention generate a new geometry for the ideal shaped reflector surface based on the current measured shaped reflector surface and the tuner data. This allows the reflector surface to be physically duplicated to a high degree of precision because the computer program adjusts the math model of the reflector surface in the same manner that the physical reflector surface can be adjusted (i.e.—at the tuner locations). By iterations of this process a near perfect reflector can be assembled.

Figure 3:
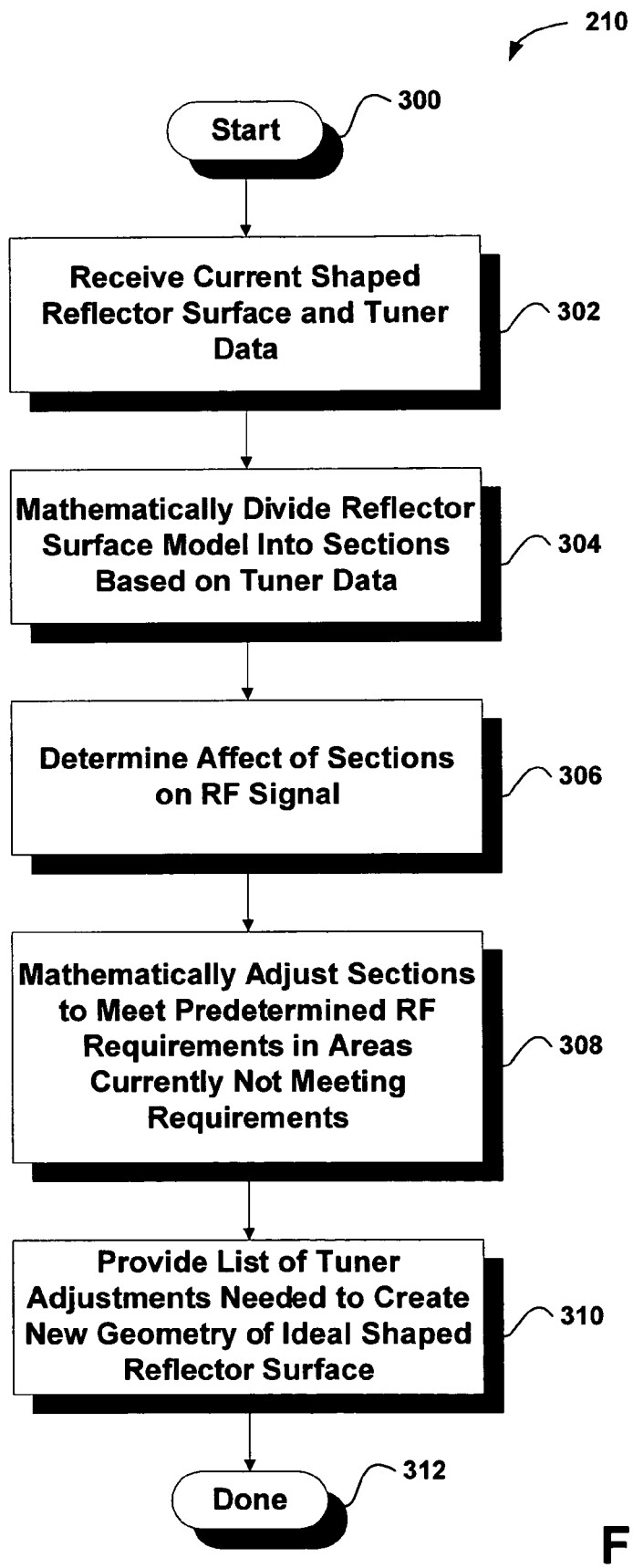
FIG. 3 is a flowchart showing a method for generating a new geometry for the ideal shaped reflector surface, in accordance with an embodiment of the present invention.

FIG. 3 is a flowchart showing a method 210 for generating a new geometry for the ideal shaped reflector surface, in accordance with an embodiment of the present invention. In an initial operation 300, preprocess operations are performed. Preprocess operations can include, for example, generating an initial ideal shaped reflector surface, building a physical shaped reflector based on the initial shaped reflector surface, and measuring the surface of the physical shaped reflector.

In operation 302, the current shaped reflector surface data and tuner data is received. For example, in one embodiment, the invention is embodied in a computer program. In this embodiment, the manufactured shaped reflector surface is measured using, for example, photogrammetry as described previously. The measurement data is then provided to the computer program, which uses the data to create a mesh reflector model that can be electronically manipulated. In addition, the locations and properties of the various tuners located on the backing structure are provided to the computer program, as illustrated in FIG. 4.

Figure 4:
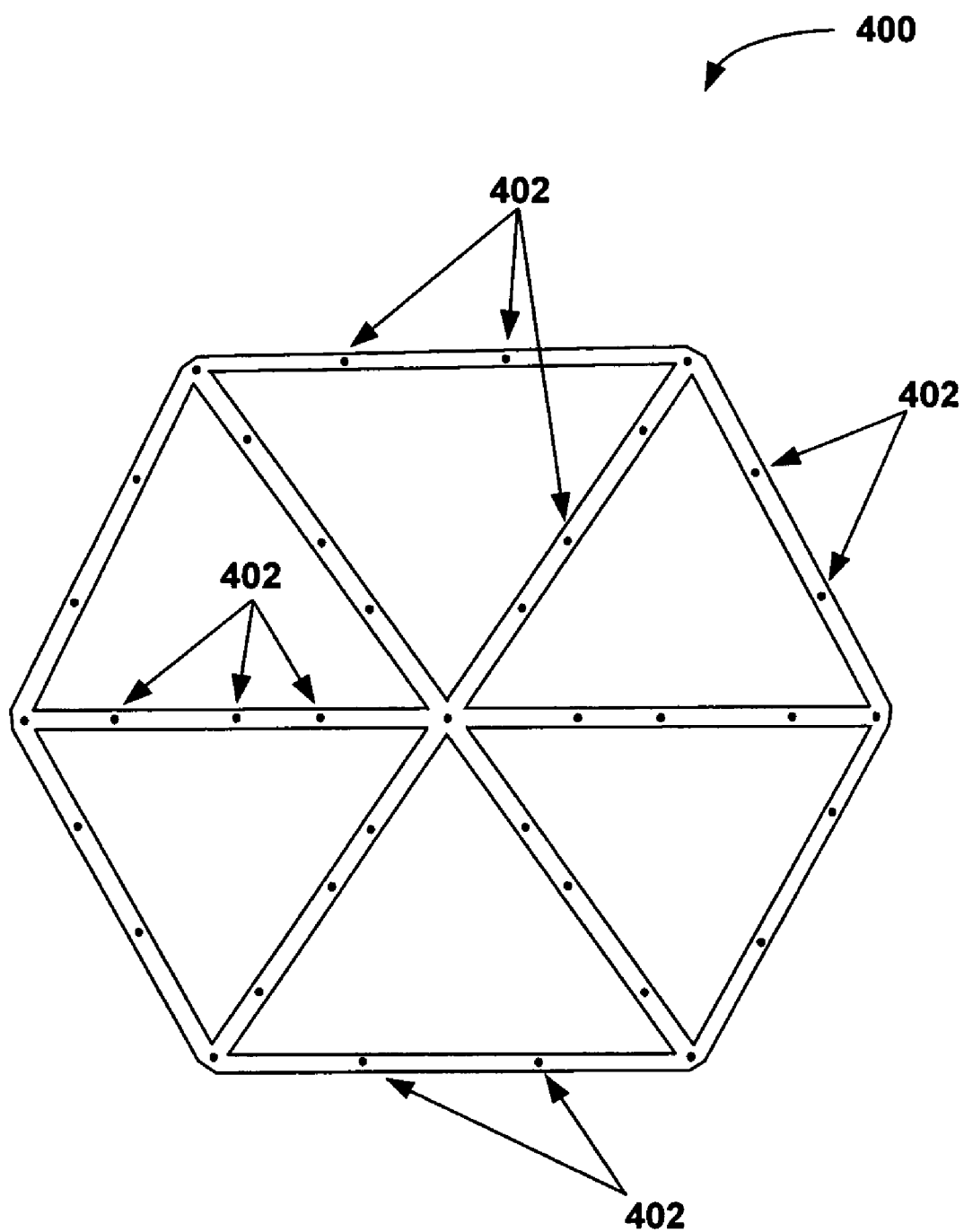
FIG. 4 is an illustration showing an exemplary backing structure having a plurality of tuners, in accordance with an embodiment of the present invention.

FIG. 4 is an illustration showing an exemplary backing structure 400 having a plurality of tuners 402, in accordance with an embodiment of the present invention. When manufacturing the shaped reflector, tuners 402 are located at discrete points along the backing structure 400. When assembled, the tuners 402 contact the backside of the shaped reflector surface. The tuners 402 provide adjustability by displacing the surface normal to the surface's defined surface plane. For example, tuners can be adjusted up and down to alter the reflector shape.

The tuners 402 can be any element capable of modifying the shaped reflector surfaces such as, shims, clips, and posts. For example, the height of clips utilized for holding the shaped reflector surface to the backing structure 400 can be adjusted. Shims wedged between the backing structure 400 and the shaped reflector can be used as tuners 402 to alter the shape of the reflector surface. Further, post can be used as tuners 402 to mount the reflector surface onto the backing structure 400. For example, the posts can be adjusted up and down to alter the shape of the reflector. Hence, the locations and other tuner properties, such as the amount and type of adjustment that can be accomplished with each tuner 402, are provided to the computer program of the embodiments of the present invention.

Referring back to FIG. 3, in operation 304, the mesh reflector model is mathematically divided into sections based on the tuner data received in operation 302.

In operation 306, the affect the sections created in operation 304 have on the RF signal is determined. Once the affect that the sections have on the RF signal are known, the program can determine which areas affect the particular reflector surfaces areas not currently meeting the predetermined RF signal requirements. In this manner, the program knows which areas to change in order to meet the requirements in a particular area, as described next in operation 308.

The sections are mathematically adjusted to meet the predetermined RF signal requirements in the particular reflector surface areas that are currently not meeting the requirements, in operation 308. Embodiments of the present invention examine the predicted RF performance of the mesh reflector model and make changes to the mesh reflector model of the shaped reflector to increase the RF performance with respect to the predetermined requirements. Thus, embodiments of the present invention concentrate on where the electromagnetic energy is focused on the Earth, rather than on the actual geometry of the reflected surface.

As mentioned previously, embodiments of the previous invention utilize knowledge of the tuner locations and tuner properties to mathematically alter the math model of the physical shaped reflector surface to achieve the predetermined RF signal requirements. Embodiments begin with the math model of the reflector surface that duplicates the existing measured as-built reflector surface. Embodiments of the present invention then manipulate the math model of the reflector surface by adjusting only the tuner locations and only in ways that can be duplicated by adjusting the actual physical tuners located at the backside of the physical shaped reflector surface. Embodiments iterate through many possible tuner adjustments to determine the optimum set of tuner adjustments to maximize the RF performance of the shaped reflector with respect to the predetermined RF requirements. As can be appreciated, the resulting new math model generally does not match the ideal shaped reflector surface initially generated. However, the new math model of the reflector surface meets the predetermined RF signal requirements, and can be physically duplicated using the physical tuners located on the backing structure.

Once the new math model is generated, a list or map of the tuner adjustments needed to create the new geometry of the ideal shaped reflector surface is provided to the user, in operation 310. Hence, embodiments of the present invention provide the user with a complete map of all the adjusting locations and what should be done at each location to duplicate the new geometry generated in operation 308. In one embodiment, if a location does not need to be adjusted, the computer program provides a zero for that location indicating no adjustment. In an alternative embodiment, the computer program can output only the locations that should be altered. In this embodiment, tuner locations skipped in the output do not need to be adjusted.

Post process operations are then performed in operation 312. Post process operations can include, for example, physically tuning the shaped reflector surface based on the provided tuner list, further RF measurement of the built reflector surface, and other post process operations that will be apparent to those skilled in the art after a careful reading of the present disclosure. In one embodiment, a measurement from the surface of the built reflector can be taken again and analyzed for compliance. In this case, if further adjusting is needed, the new reflector shape is provided to the program, along with the current RF results, and new adjustment output is generated. The new adjustment output can then be used to alter the reflector shape again, bringing the RF output further in line with the predetermined requirements.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A computer program embodied on a computer readable medium, comprising:
   program instructions that receive current reflector geometry data defining a manufactured shaped reflector;
   program instructions that receive required performance data defining a desired RF performance of the manufactured shaped reflector;
   program instructions that manipulate a mathematical model based on the current reflector geometry data of the manufactured shaped reflector to generate a new geometry for the manufactured shaped reflector capable of generating the desired RF performance, wherein the program instructions manipulate the mathematical model in a manner that can be duplicated using a plurality of tuners associated with the manufactured shaped reflector; and
   program instructions that output data defining alterations to the plurality of tuners to generate the new geometry for the manufactured shaped reflector;
   wherein the current reflector geometry data is measured from the manufactured shaped reflector.

2. A computer program as recited in claim 1, further comprising program instructions that model an RF signal based on the new geometry for the manufactured shaped reflector.

3. A computer program as recited in claim 2, further comprising program instructions that compare the RF signal to the required performance data to determine a signal performance difference.

4. A computer program as recited in claim 3, further comprising program instructions that alter the new geometry for the manufactured shaped reflector when the signal performance difference exceeds a predetermined threshold.

5. A computer program as recited in claim 1, wherein the current reflector geometry data includes tuner data for the plurality of tuners in contact with the manufactured shaped reflector, each tuner being capable of altering a contour of the manufactured shaped reflector.

6. A computer program as recited in claim 5, further comprising program instructions that utilize the tuner data to manipulate the mathematical model in a manner that can be duplicated using the plurality of tuners.

7. A method comprising:
receiving current reflector geometry data defining a manufactured shaped reflector;
receiving required performance data defining a desired RF performance of the manufactured shaped reflector;
manipulating a mathematical model based on the current reflector geometry data of the manufactured shaped reflector to generate a new geometry for the manufactured shaped reflector capable of generating the desired RF performance, wherein the mathematical model is manipulated in a manner that can be duplicated using a plurality of tuners associated with the manufactured shaped reflector; and
providing output data defining alterations to the plurality of tuners to generate the new geometry for the manufactured shaped reflector;
wherein the current reflector geometry data is measured from the manufactured shaped reflector.

8. A method as recited in claim 7, further comprising the operation of modeling an RF signal based on the new geometry for the manufactured shaped reflector.

9. A method as recited in claim 8, further comprising the operation of comparing the RF signal to the required performance data to determine a signal performance difference.

10. A method as recited in claim 9, further the operation of altering the new geometry for the manufactured shaped reflector when the signal performance difference exceeds a predetermined threshold.

11. A method as recited in claim 7, wherein the current reflector geometry data includes tuner data for the plurality of tuners in contact with the manufactured shaped reflector, each tuner being capable of altering a contour of the manufactured shaped reflector.

12. A method as recited in claim 11, wherein the tuner data is utilized to manipulate the mathematical model in a manner that can be duplicated using the plurality of tuners.

13. A method comprising:
receiving current reflector geometry data defining a manufactured shaped reflector, the current reflector geometry data including tuner data for a plurality of tuners in contact with the manufactured shaped reflector, each tuner being capable of altering a contour of the manufactured shaped reflector;
receiving required performance data defining a desired RF performance; and
determining a new geometry for the manufactured shaped reflector based on the current reflector geometry data and the tuner data, wherein the new geometry is generated by manipulating geometry that can be duplicated using the plurality of tuners, and wherein the manufactured shaped reflector having the new geometry is capable of generating the desired RF performance;
wherein the current reflector geometry data is measured from the manufactured shaped reflector.

14. A method as recited in claim 13, further comprising the operation of providing tuner adjustment data defining alterations to the plurality of tuners to generate the new geometry for the manufactured shaped reflector.

15. A method as recited in claim 14, further comprising the operation of providing physically adjusting the plurality of tuners in contact with the manufactured shaped reflector to generate the new geometry for the manufactured shaped reflector based on the tuner adjustment data.

16. A method as recited in claim 13, further comprising the operation of mathematically dividing the current reflector geometry data into sections based on the tuner data.

17. A method as recited in claim 16, further comprising the operation of determining a set of failing sections, wherein the set of failing sections includes sections that do not meet the desired RF performance based on the required performance data.

18. A method as recited in claim 17, further comprising the operation of mathematically adjusting failing sections to generate the new geometry.

* * * * *